United States Patent
Ando

(12) 
(10) Patent No.: US 6,369,456 B1
(45) Date of Patent: Apr. 9, 2002

(54) SEMICONDUCTOR DEVICE AND PRODUCING METHOD THEREOF

(75) Inventor: Masateru Ando, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/162,787

(22) Filed: Sep. 30, 1998

(30) Foreign Application Priority Data

Oct. 9, 1997 (JP) ............................................. 9-276886

(51) Int. Cl.[7] ............................................. H01L 23/544
(52) U.S. Cl. ........................ 257/797; 257/620; 438/401; 438/462
(58) Field of Search ................................. 257/797, 620, 257/306; 438/401, 462, 975

(56) References Cited

U.S. PATENT DOCUMENTS 5,162,881 A * 11/1992 Ohya ........................... 257/309

FOREIGN PATENT DOCUMENTS

| JP | 2-152218 | 6/1990 |
| JP | 4-290419 | 10/1992 |
| JP | 7-45507 | 2/1995 |

OTHER PUBLICATIONS

Japanese Office Action dated Feb. 1, 2000, with partial translation.

* cited by examiner

*Primary Examiner*—Mark V. Prenty
(74) *Attorney, Agent, or Firm*—McGinn & Gibb, PLLC

(57) ABSTRACT

A semiconductor device and a producing method thereof in which a step or difference in height between a first resist trace for forming a wiring pattern within a production region and a second resist trace for forming an accessory pattern such as an alignment mark is largely reduced. The second resist trace is formed on a projection part. The projection part is composed of insulating layers and conductive layers, which are intentionally left, corresponding to first and second interlayer insulating films, a storage electrode and a plate electrode formed in the wiring pattern within the production region and further of a second upper wiring and a ground film of a conventional device. With the largely reduced height difference between the two patterns, a focusing adjustment between the two patterns can be improved and the resist shapes can be formed with high accuracy.

20 Claims, 8 Drawing Sheets

SEMICONDUCTOR DEVICE AND PRODUCING METHOD THEREOF

BACKGROUND OF THE INVENTION

The present invention relates to semiconductor device and a producing method of a semiconductor device, and more particularly to an accessory pattern structure such as an alignment mark in a semiconductor device and a producing method of an accessory pattern structure.

Description of the Related Art

In recent years, with high integration of LSIs, element areas are reduced year by year, and alignment accuracy improvement is one of important factors in producing a semiconductor device while holding high yield. One factor on which the alignment accuracy largely depends is visibility of an alignment mark, and a good resist form should be thus ensured.

In FIGS. 1 to 4, there is shown a producing method of a conventional alignment mark in a semiconductor device such as a DRAM using a stacked capacitor structure. In FIG. 1, a numeral 1 denotes a semiconductor substrate made of P-type silicon or the like. On a nonactive region of this semiconductor substrate 1, generally, a field oxide film for element separation is formed, and on its active region, for example, a word line made of a first polycrystalline silicon layer and an N⁻-type diffusion layer are formed in succession.

Subsequently, a first interlayer insulating film such as a $SiO_2$ layer, a BPSG layer or the like is deposited over the entire surface of the semiconductor substrate 1, and a contact for connecting a bit line made of a second polycrystalline silicon layer and the N⁻-type diffusion layer is prepared. Then, the bit line of the second polycrystalline silicon layer is formed. Further, a second interlayer insulating film is deposited so as to cover the entire surface of the semiconductor substrate 1, and thereafter a contact for connecting a storage electrode 3 having a stacked capacitor structure made of a third polycrystalline silicon layer and the N⁻-type diffusion layer is formed. The first interlayer insulating film and the second interlayer insulating film, which are deposited before the formation of the storage electrode 3 constitute an interlayer insulating film 2.

Next, the storage electrode 3 having the stacked capacitor structure made of the third polycrystalline silicon layer and a plate electrode 4 made of a fourth polycrystalline silicon layer are formed consecutively, and subsequently a third interlayer insulating film 5 having a relatively thick form is deposited. At this time, the third interlayer insulating film 5 is flattened by, for instance, a conventional CMP (chemical mechanical polishing) technique or the like in order to reduce a step caused between a cell region and a peripheral circuit region by the formation of the storage electrode 3. Moreover, a scribe line region 6 is formed using a conventional photolithographic technique and an etching technique. At this time, the total film thickness formed on the semiconductor substrate 1 is, for example, approximately 2000 nm.

In FIG. 2, a first upper wiring 7 such as W, AL or the like is formed on the third interlayer insulating film 5, and then a metal interlayer film 8a made of, for example, a plasma-$SiO_2$ is deposited to cover the first upper wiring 7. A contact (through hole) for coupling the first upper wiring 7 with a second upper wiring 9 (see FIG. 3) is then formed. Simultaneously, on the scribe line region 6, a ground film 8b made of the metal interlayer film 8a of the plasma-$SiO_2$ is prepared under a region where an alignment mark of the second upper wiring step is formed in the following step.

In FIG. 3, the second upper wiring layer 9 such as W, AL or the like is deposited and a photoresist film 10 is then applied to cover the whole surface.

Finally, in FIG. 4, the photoresist film 10 is patterned using the conventional photolithographic technique to prepare a first resist trace 10a for forming a wiring trace of the second upper wiring 9 within a production region and a second resist trace 10b for forming an alignment mark. At this time, a step or difference in height of approximately 2200 to 2400 nm is produced between the first and the second resist traces 10a and 10b.

Hence, in the case that the photolithographic technique is used, a focal length of the first resist trace 10a for the wiring trace within the production region is different from that of the second resist trace 10b for the alignment mark. Hence, the resist shape of the second resist trace 10b for forming the alignment mark is extremely degraded, resulting in many problems such as yield drop, and failure to hold the accessory pattern resist such as the alignment mark to cause a pattern separation in etching the second upper wiring 9 and thus yield drop.

Concerning the first problem, when the alignment mark of the second upper wiring step and the accessory pattern are formed, the alignment mark and the accessory pattern are not well prepared to drop the alignment accuracy.

The reason is as follows. That is, with the high integration in the device, the total stacked layers become thick, and a large step or difference in height is caused between the first pattern of the second upper wiring step within the production region and the second pattern such as the alignment mark formed in the lower position than the first pattern. Hence, when the conventional photolithographic technique is used, the two patterns are different in their focal lengths, and it is difficult to prepare the alignment mark and the accessory pattern with high accuracy (having good resist shapes) in the second upper wiring step.

Regarding the second problem, the pattern separation comes off the alignment mark part and the accessory pattern part in the etching step after the formation of the alignment mark of the second upper wiring step and the accessory pattern to cause the yield drop.

The reason is as follows. That is, when the conventional photolithographic technique is used, there is a large height difference between the first pattern of the second upper wiring step within the production region and the second pattern or the alignment mark and the accessory pattern formed in the lower position than the first pattern, and the first and second resist patterns are different in their focal lengths. The resist shape of the accessory pattern such as the alignment mark is extremely made worse, and the resist cannot be held to cause the pattern separation in the etching step.

SUMMARY OF THE INVENTION

It is therefore an object of the present invention to provide a semiconductor device in view of the aforementioned problems of the prior art, which is capable of improving alignment accuracy without increasing a nurber of steps, and preventing patterns coming off alignment mark part and the like to avoid yield drop.

It is another object of the present invention to provide a production method of a semiconductor device, which is capable of improving alignment accuracy without increasing a nurber of steps, and preventing patterns coming off alignment mark part and the like to avoid yield drop.

In accordance with one aspect of the present invention, there is provided a semiconductor device comprising a substrate and a projection part for forming an accessory pattern, formed on the substrate.

In accordance with another aspect of the present invention, there is provided a producing method of a semiconductor device, comprising a step for forming a projection part for forming an accessory pattern on a substrate.

In the present invention, the projection part can includes a plurality of insulating layers or a plurality of conductive layers. The plurality of insulating layers or conductive layers of the projection part can correspond to a plurality of insulating layers or conductive layers formed in a pattern part within a production region on the substrate.

In the present invention, the projection part formation step includes steps for forming a plurality of insulating layers or conductive layers. The plurality of insulating layers or conductive layers are left in steps for forming a plurality of insulating layers or conductive layers in a pattern part within a production region on the substrate.

Further, the accessory pattern can include an alignment mark of an upper wiring step.

According to the present invention, the height difference between the wiring pattern and the accessory pattern can be largely reduced. Hence, the alignment accuracy of the upper wiring step can be improved without increasing the number of steps in the conventional process. Further, the pattern separation of the alignment mark and the accessory pattern off the surface can be prevented, and yield drop can be prevented.

BRIEF DESCRIPTION OF THE DRAWINGS

The objects, features and advantages of the present invention will become more apparent from the consideration of the following detailed description, taken in conjunction with the accompanying drawings, in which.

DESCRIPTION OF THE PREFERRED EMBODIMENTS

Figure 7:
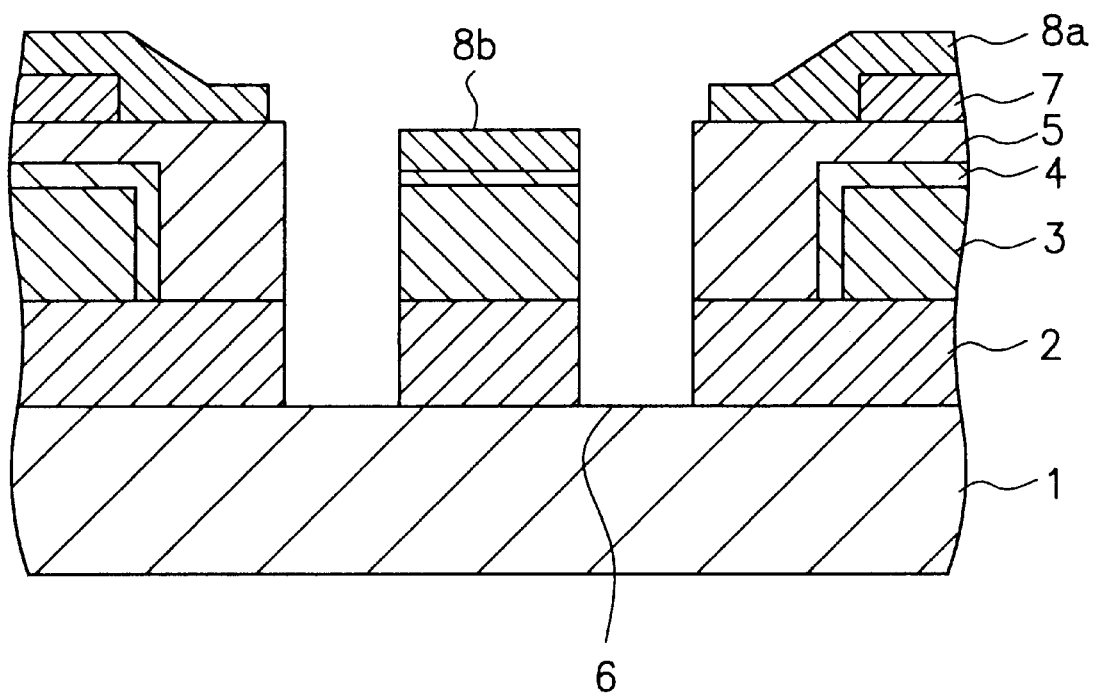
Figure 8:
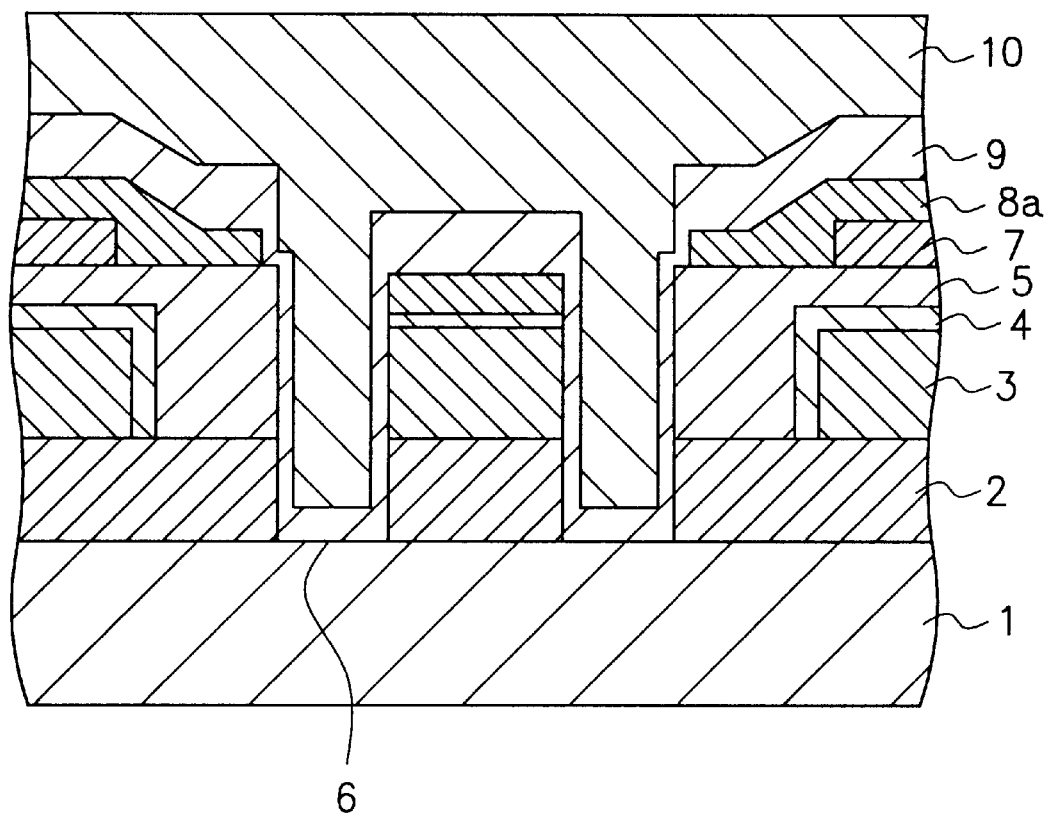
Figure 9:
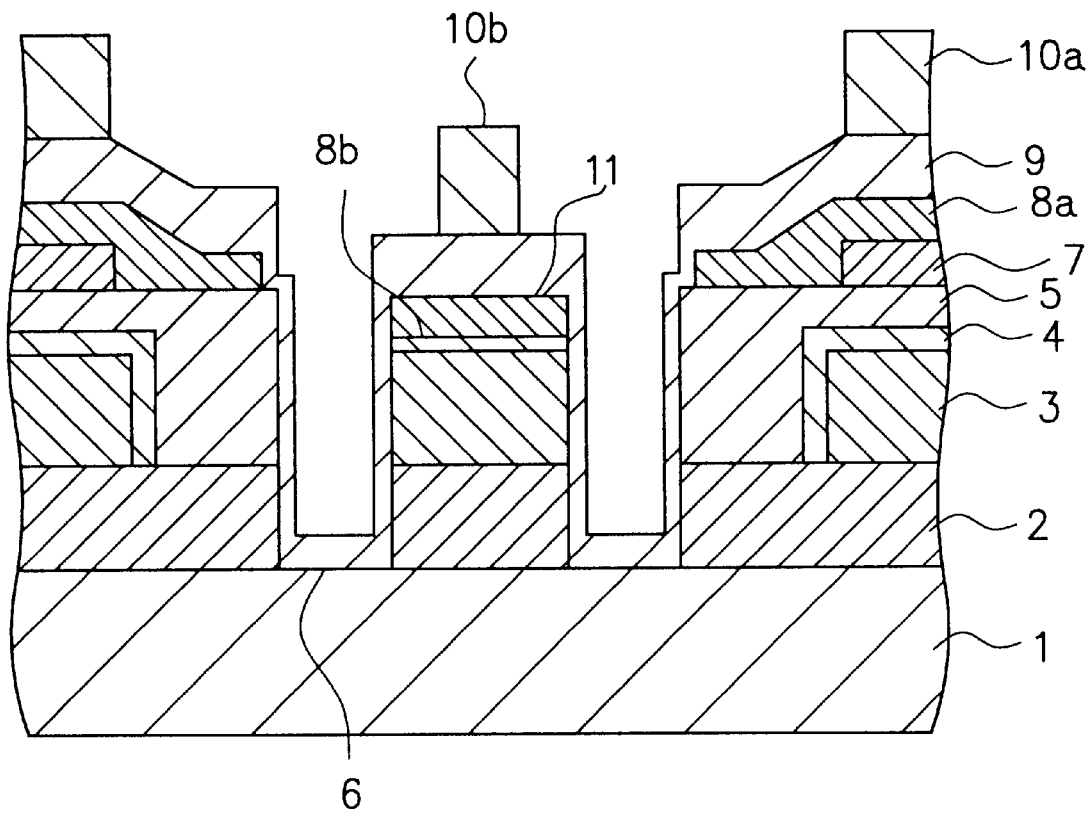

Referring now to the drawings, there is shown in FIGS. 5 to 9 a producing method of a semiconductor device such as a DRAM having a stacked capacitor structure in succession. FIG. 9 illustrates the final step of the producing method.

Figure 1:
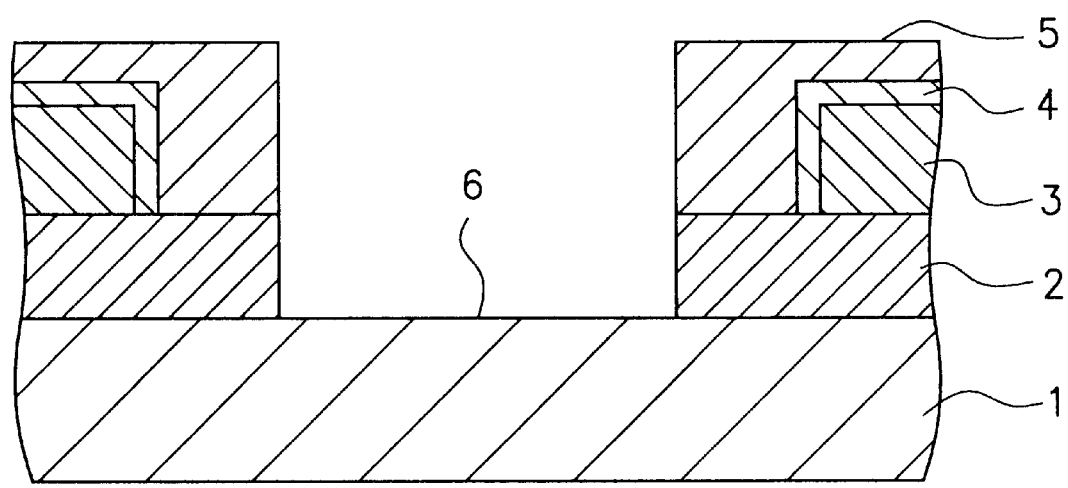
FIGS. 1 to 4 are schematic cross sections showing a producing method of a conventional semiconductor device in succession, FIG. 4 showing the final process.
Figure 2:
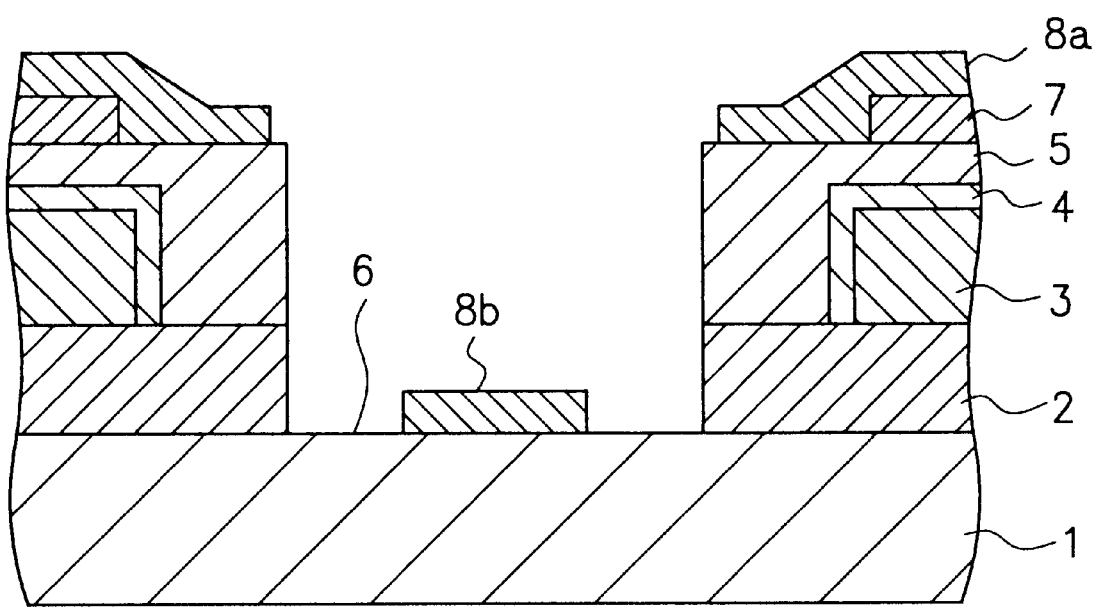
Figure 3:
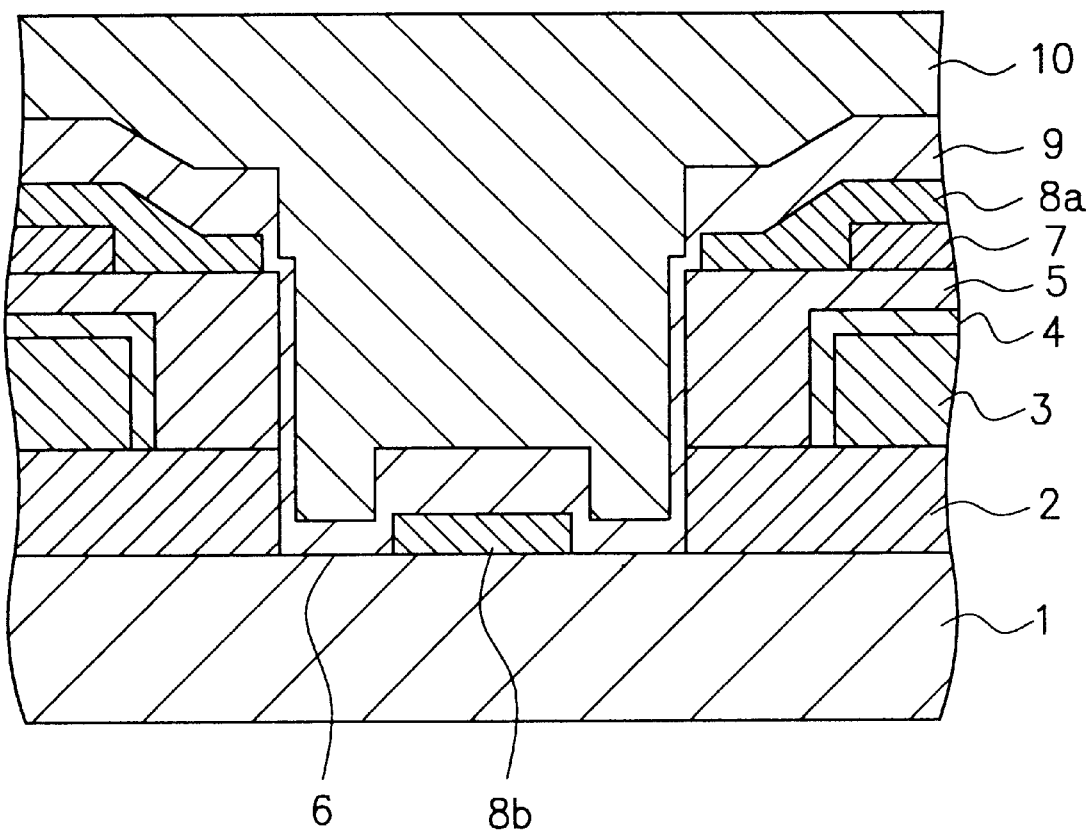
Figure 4:
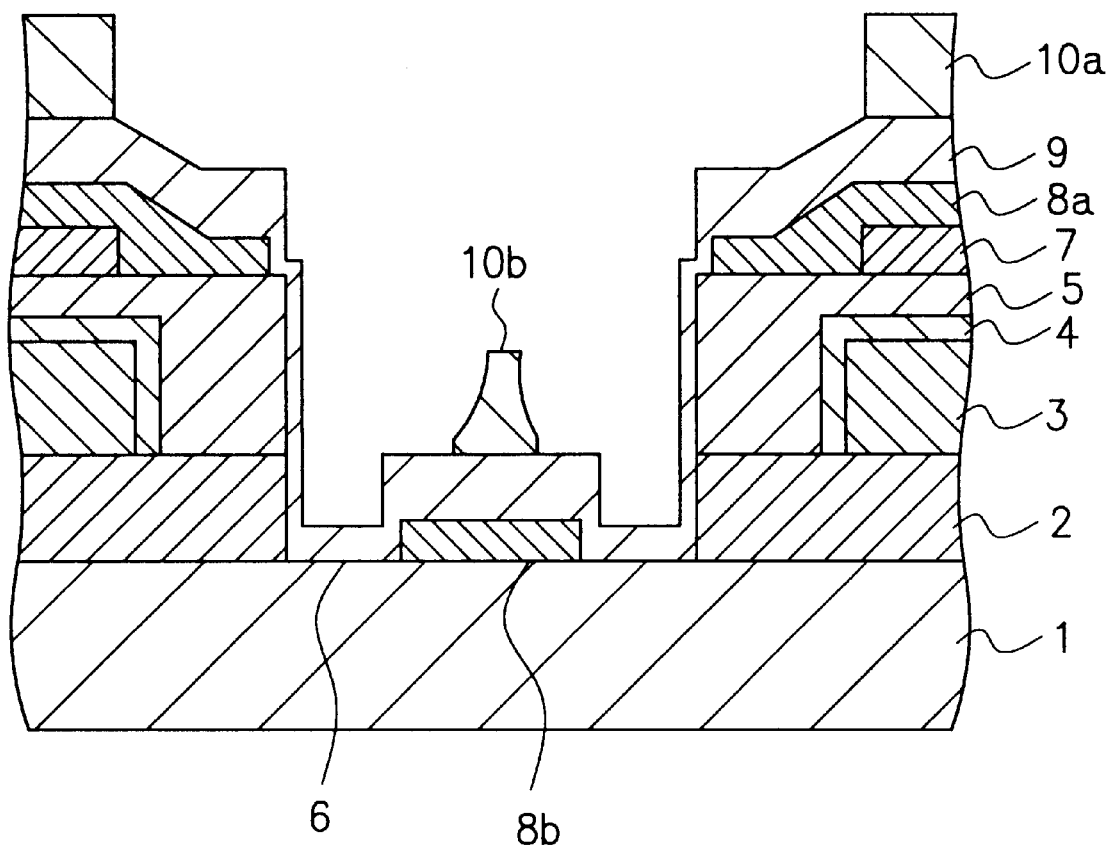
Figure 5:
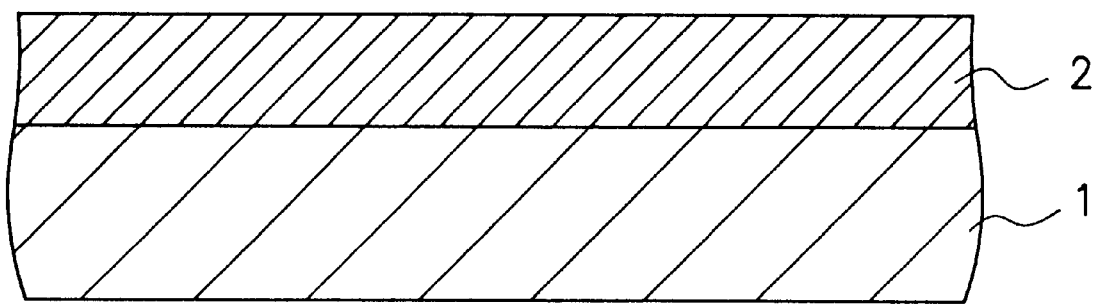
FIGS. 5 to 9 are schematic cross sections showing a producing method of a semiconductor device in succession according to the present invention, FIG. 9 showing the final process.

First, in FIG. 5, on a P-type silicon semiconductor substrate 1, a field oxide film having a thickness of approximately 400 nm is selectively formed by a LOCOS method to partition an active region. A gate oxide film having a thickness of approximately 15 nm is formed on the active region by a thermal oxidation method. A first polycrystalline silicon layer having a thickness of approximately 200 nm is further deposited on the gate oxide film, and a patterning is applied to the surface using a conventional photolithographic technique to prepare a gate electrode. Then, by using the field oxide film and the gate electrode as a mask, an impurity such as phosphorus or the like is implanted into the semiconductor substrate 1 to form an N⁻-type diffusion layer (LDD region) in its surface.

Then, a first interlayer insulating film such as a $SiO_2$ layer, a BPSG layer or the like is deposited over the entire surface of the semiconductor substrate 1, and a contact for connecting a bit line made of a second polycrystalline silicon layer and the N⁻-type diffusion layer is prepared using the conventional photolithographic technique and a dry etching (anisotropic) technique. Then, the bit line of the second polycrystalline silicon layer is formed. Further, a second interlayer insulating film is deposited so as to cover the entire surface of the semiconductor substrate 1, and thereafter a contact for connecting a storage electrode 3 (see FIGS. 6 to 9) having a stacked capacitor structure made of a third polycrystalline silicon layer and the N⁻-type diffusion layer is formed. The first interlayer insulating film and the second interlayer insulating film, which are deposited before the formation of the storage electrode 3 constitute an interlayer insulating film 2 having a thickness of approximately 600 to 700 nm.

Figure 6:
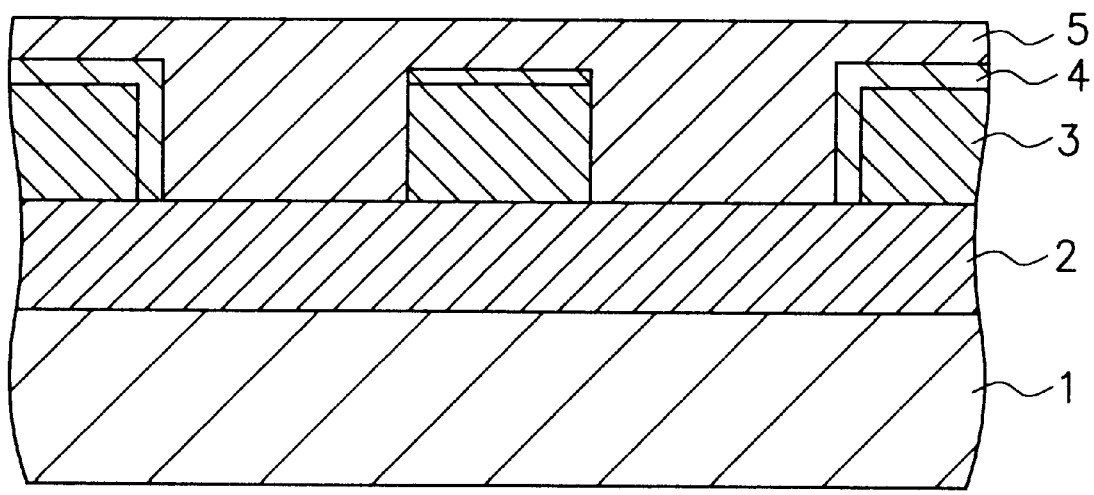

Next, in FIG. 6, a third polycrystalline silicon layer having a thickness of approximately 600 to 800 nm constituting a storage electrode 3 having a stacked capacitor structure and a fourth polycrystalline silicon layer having a thickness of approximately 200 nm constituting a plate electrode 4 are deposited over the entire surface of the semiconductor substrate 1, respectively, and the storage electrode 3 and the plate electrode 4 are formed on the interlayer insulating film 2 in succession using the conventional photolithographic technique and an etching technique. At this time, parts of the third polycrystalline silicon layer constituting the storage electrode 3 and the fourth polycrystalline silicon layer constituting the plate electrode 4 are left on purpose on the interlayer insulating film 2 under a region where an alignment mark of a second upper wiring step is formed in the following step.

Subsequently, a third interlayer insulating film 5 having a relatively large thickness of approximately 1500 nm is deposited over the entire surface. Thereafter, the third interlayer insulating film 5 is flattened by polishing its surface of approximately 300 nm using, for example, a conventional CMP (chemical mechanical polishing) technique or the like in order to reduce a step or difference in height caused between a cell region and a peripheral circuit region by the formation of the storage electrode 3. Alternatively, the flattening may be performed by, for instance, applying etchback using (63) BHF or the like.

In FIG. 7, a contact for connecting a first upper wiring 7 such as W, AL or the like and the N⁻-type diffusion layer and a scribe line region 6 are formed using the conventional photolithographic technique and the etching technique. At this time, while the fourth polycrystalline silicon layer for the plate electrode 4 acts as a mask in etching, parts of the third polycrystalline silicon layer for the storage electrode 3 and the interlayer insulating film 2 can be left under the region where the alignment mark of the second upper wiring step is formed in the later step.

Next, the first upper wiring 7 such as W, AL or the like having a thickness of approximately 400 to 500 nm is formed on the third interlayer insulating film 5, and then a metal interlayer film 8a made of, for example, a plasma-$SiO_2$ having a thickness of approximately 500 nm is deposited to cover the first upper wiring 7. Further, a contact (through hole) for connecting the first upper wiring 7 and a second upper wiring 9 (see FIG. 8) is formed, and simultaneously a ground film 8b made of the metal interlayer film 8a of the plasma-$SiO_2$ is deposited on the fourth polycrystalline silicon layer under the region where the alignment mark of the second upper wiring step is formed in the later step.

In FIG. 8, a second upper wiring 9 such as W, AL or the like having a thickness of approximately 800 to 900 nm is deposited on the entire surface by a conventional sputtering method, and a photoresist film 10 is then applied to cover the entire surface.

Finally, in FIG. 9, the photoresist film 10 is patterned using the conventional photolithographic technique to prepare a first resist trace 10a for forming a wiring trace of the second upper wiring 9 within a production region and a second resist trace 10b for forming an accessory pattern such as an alignment mark. In this embodiment, a step or difference in height between the first resist trace 10a within the production region and the second resist trace 10b constituting the alignment mark is approximately 500 to 700 nm which is largely reduced by approximately 1500 to 1700 nm compared with the conventional case having the step of approximately 2200 to 2400 nm.

In this embodiment, as described above, the height difference between the wiring pattern within the production region and the accessory pattern such as the alignment mark is largely diminished, and the problem of the focal length difference between the two patterns can be solved. Hence, the resist shape of the second resist trace 10b for forming the alignment mark can be produced with high accuracy, resulting in improving alignment accuracy and holding the good resist shape of the accessory pattern such as the alignment mark to prevent the pattern separation.

As described above, according to the present invention, the second resist trace 10b for forming the accessory pattern such as the alignment mark is formed on a stacked projection part 11 deposited on the semiconductor substrate 1. This projection part 11 is composed of the insulating layer and the conductive layer corresponding to the conventional ground film 8b and the second upper wiring 9, and the insulating layer and the conductive layers corresponding to the interlayer insulating film 2, the storage electrode 3 and the plate electrode 4 of the present invention.

According to the present invention, the following advantages can be obtained.

First, the alignment accuracy of the upper wiring step can be improved without increasing the step number in the conventional process.

The reason is as follows. That is, the accessory pattern such as the alignment mark of the upper wiring step is formed on the projection part which is prepared by intentionally leaving, for example, the polycrystalline layers and the interlayer insulating films composed of, for example, the $SiO_2$ layer and the BPSG layer on the semiconductor substrate 1. Hence, the accessory pattern such as the alignment mark can be formed in a not so lower position than the wiring pattern within the production region, and the height difference between the wiring pattern and the accessory pattern can be largely reduced.

Second, in the etching of the upper wiring step, the pattern separation of the alignment mark and the accessory pattern off the surface can be prevented, and yield drop by a short circuit or the like due to the pattern separation can be prevented.

The reason is as follows. That is, the height difference between the wiring pattern of the upper wiring step within the production region and the accessory pattern such as the alignment mark formed generally in a lower position is largely reduced. Hence, the extreme deterioration of the resist shape of the accessory pattern such as the alignment mark can be effectively prevented, and the resist shape having high accuracy can be obtained.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor device comprising:
   a substrate;
   a first projection part formed on the substrate and comprising a first resist trace for forming an accessory pattern; and
   a second projection part, formed in a production region of said substrate, and comprising a second resist trace for forming a wiring trace,
   wherein a height of said first projection part is substantially the same as a height of said second projection part, and
   wherein said first projection part comprises a storage electrode and a plate electrode.

2. The semiconductor device of claim 1, wherein the first projection part comprises a plurality of insulating layers.

3. The semiconductor device of claim 1, wherein the first projection part comprises a plurality of conductive layers.

4. The semiconductor device of claim 2, wherein the plurality of insulating layers of the first projection part correspond to a plurality of insulating layers formed in a pattern part within the production region on the substrate.

5. The semiconductor device of claim 3, wherein the plurality of conductive layers of the first projection part correspond to a plurality of conductive layers formed in a pattern part within the production region on the substrate.

6. The semiconductor device of claim 1, wherein the accessory pattern includes an alignment mark of an upper wiring step.

7. A producing method of a semiconductor device, comprising:
   forming a first projection part for forming an accessory pattern on a substrate, said first projection part comprising a first resist trace for forming the accessory pattern; and
   forming a second projection part in a production region of said substrate, said second projection part comprising a second resist trace for forming a wiring trace,
   wherein a height of said first projection part is substantially the same as a height of said second projection part, and
   wherein said first projection part comprises a storage electrode and a plate electrode.

8. The producing method of a semiconductor device of claim 7, wherein the first projection part formation includes forming a plurality of insulating layers.

9. The producing method of a semiconductor device of claim 7, wherein the first projection part formation step includes forming a plurality of conductive layers.

10. The producing method of a semiconductor device of claim 8, wherein the plurality of insulating layers are left in forming a plurality of insulating layers in a pattern part within the production region on the substrate.

11. The producing method of a semiconductor device of claim 9, wherein the plurality of conductive layers are left in forming a plurality of conductive layers in a pattern part within the production region on the substrate.

12. The producing method of a semiconductor device of claim 7, wherein the accessory pattern includes an alignment mark of an upper wiring step.

13. The semiconductor device as claimed in claim 1, wherein said first projection part comprises a ground film layer, a wiring layer, and an interlayer insulating film layer.

14. A semiconductor device comprising:

a substrate;

a first projection part formed on the substrate and comprising a first resist trace for forming an accessory pattern; and a second projection part, formed in a production region of said substrate, and comprising a second resist trace for forming a wiring trace, wherein a height of said first projection part is substantially the same as a height of said second projection part, wherein the difference in height between said first projection part and said second projection part is substantially within a range of about 500 nm to about 700 nm.

15. The semiconductor device of claim 1, wherein a focal length of said wiring pattern within the production region and the accessory pattern are substantially the same.

16. The semiconductor device of claim 13, wherein said first resist trace is formed on said wiring layer, and said wiring layer is formed on said ground film layer, and wherein said ground film layer is formed on said plate electrode, and said plate electrode is formed on said storage electrode, said storage electrode being formed on said interlayer insulating film.

17. The producing method of claim 7, wherein said first projection part comprises a ground film layer, a wiring layer, and an interlayer insulating film layer.

18. A producing method of a semiconductor device, comprising:

forming a first projection part for forming an accessory pattern on a substrate, said first projection part comprising a first resist trace for forming the accessory pattern; and forming a second projection part in a production region of said substrate, said second projection part comprising a second resist trace for forming a wiring trace, wherein a height of said first projection part is substantially the same as a height of said second projection part, and wherein the difference in height between said first projection part and said second projection part is substantially within a range of about 500 nm to about 700 nm.

19. The producing method of claim 7, wherein a focal length of said wiring pattern within the production region and the accessory pattern are substantially the same.

20. The producing method of claim 17, wherein said first resist trace is formed on said wiring layer, and said wiring layer is formed on-said ground film layer, and wherein said ground film layer is formed on said plate electrode, and said plate electrode is formed on said storage electrode, said storage electrode being formed on said interlayer insulating film.

* * * * *